(12) United States Patent
Wellman (10) Patent No.: US 9,756,437 B2
(45) Date of Patent: Sep. 5, 2017

(54) SYSTEM AND METHOD FOR TRANSMITTING ENVIRONMENTAL ACOUSTICAL INFORMATION IN DIGITAL AUDIO SIGNALS

(76) Inventor: Joe Wellman, Salisbury, MD (US)

( * ) Notice: Subject to any disclaimer, the term of this patent is extended or adjusted under 35 U.S.C. 154(b) by 1075 days.

(21) Appl. No.: 13/541,562

(22) Filed: Jul. 3, 2012

(65) Prior Publication Data

US 2014/0010379 A1 Jan. 9, 2014

(51) Int. Cl.
| | |
|---|---|
| H04R 29/00 | (2006.01) |
| H04R 3/00 | (2006.01) |
| H04S 5/00 | (2006.01) |
| H04S 7/00 | (2006.01) |
| H04S 1/00 | (2006.01) |
| H03G 5/00 | (2006.01) |

(52) U.S. Cl.
CPC .............. H04R 29/00 (2013.01); H04S 5/00 (2013.01); H03G 5/005 (2013.01); H04R 29/001 (2013.01); H04S 1/00 (2013.01); H04S 7/301 (2013.01)

(58) Field of Classification Search
CPC ........ H04R 29/00; H04R 29/001; H04R 5/04; H04R 2499/13; H04R 3/00; H04R 3/04; H04S 7/30; H04S 7/301; H04S 7/305; H04S 7/307; G06F 3/16; G06F 3/162–3/167; G06F 17/3074; G06F 17/30749; G06F 17/30752

USPC ......... 381/56, 58–59, 98, 61, 95, 96; 700/94
See application file for complete search history.

(56) References Cited

U.S. PATENT DOCUMENTS

| | | | | |
|---|---|---|---|---|
| 4,739,513 | A  * | 4/1988 | Kunugi et al. ................. | 381/103 |
| 5,511,129 | A  * | 4/1996 | Craven .................. | H03G 5/165 |
| | | | | 381/103 |
| 7,155,017 | B2 * | 12/2006 | Kim et al. ...................... | 381/59 |
| 7,333,863 | B1 * | 2/2008 | Lydecker et al. ............... | 700/94 |
| 8,731,206 | B1 * | 5/2014 | Park ............................... | 381/59 |
| 2005/0113058 | A1 * | 5/2005 | Gosieski, Jr. ................. | 455/345 |
| 2007/0121958 | A1 * | 5/2007 | Berson ........................... | 381/61 |
| 2008/0008070 | A1 * | 1/2008 | Kwon .......................... | 369/53.1 |
| 2008/0232603 | A1 * | 9/2008 | Soulodre ........................ | 381/63 |
| 2010/0260483 | A1 * | 10/2010 | Strub .............................. | 386/97 |

* cited by examiner

Primary Examiner — Xu Mei (57) ABSTRACT

Disclosed are systems and methods for enhancing playback of an audio signal to approximate the listening experience at a recording site. A test signal is emitted into a recording environment and acoustic parameters for the recording environment are calculated according to the test signal and a response to the test signal. An encoded signal including a recording of an audio event in the recording environment and the acoustic parameters is then transmitted to a listening site or affixed to a medium. At the listening site the acoustic parameters are extracted and the recording is enhanced or corrected according to the acoustic parameters. Acoustic parameters for the listening site may also be calculated and the recording may be further enhanced therewith. During playback of the enhanced recording, the sound may be measured and the enhanced recording may be actively enhanced during playback according to the measurement.

20 Claims, 7 Drawing Sheets

SYSTEM AND METHOD FOR TRANSMITTING ENVIRONMENTAL ACOUSTICAL INFORMATION IN DIGITAL AUDIO SIGNALS

BACKGROUND

1. Field of the Invention

This application relates to the delivery of acoustically corrected playback of recorded audio in an enclosure like a car, living room, studio, hall, or any environment where the audio is played through speakers or earphones.

2. Background of the Invention

When an audio recording takes place it is usually a staged venue, either in a studio, live event which could be in a small club, concert stage or an auditorium, and usually has a recording engineer running an audio mixing device with a number of microphones and line inputs to enhance the audio recording. One of the more important aspects of the recording is the enclosure where the recording takes place is what is termed "an acoustic environment." In many cases, such as a large concert hall, the enclosure has been acoustically designed to enhance the listening experience for the audience. We have all listened to a symphony played by a large orchestra in a hall where the acoustics are designed to enhance the music and marveled at the sound. Yet if we have a recording of the exact piece, when we play it at home or in the car the sound lacks the presence we remember.

The quality of the sound is also affected by the electrical components used to reproduce it. For example the amplifier through which the recording is played will alter the sound by amplifying, cutting, or delaying certain aspects of the original signal due to the amplifier's inherent frequency response. Also proper speakers are needed with enough range to cover the audible frequency range (20 Hz to 20 KHz). Placement of the speaker or speakers is also important to balance the sound arriving to the ear. However, this will not correct the deficiencies inasmuch as enclosure acoustics will still affect the sound delivery to the ear.

There are devices, practices, and systems that allow amplifiers to play audio in an environment, which has been corrected dynamically by modifying the speaker and amplifier response using active filters. These modifications to the playback sound fit the acoustics of the enclosure so as to allow the ear to receive audio as a flat response without reflective variances of the sound waves. The devices, practices and systems mentioned are well known to the current audio recording industry.

As television systems have evolved to offer high definition, so too has the quality of the sound accompanying the video program. At the time the transmission system transitioned to ATSC (Advanced Television Standards Committee) the audio playback system also changed from stereo to AC3, which was invented by Dolby™ and is referred to as Dolby Digital™. This audio system offers 5.1 channels of digital compressed audio as part of the MPEG 2 digital transmission standard for terrestrial broadcast, which is also a compressed format.

Because of these and other changes, analog audio has effectively changed to a digital scheme called AES/EBU (Audio Engineering Society/European Broadcast Union). This standard incorporated in Europe originally was adopted in the US so as to enhance facilities' audio transmission and routing in mixing and distribution of the audio signals for television, radio and other programs. Digital audio offers many advantages over analog audio including dynamic range of over 100 dB or better (based on the bit size and sample rate of the AES signal) and the ability to transmit the signal over long copper cables or even further via fiber optic networks due to it being a serial data scheme. Also one can transmit two audio channels together because of the structure of the AES signal. There are many different styles of the AES standard but this application concerns itself principally with AES 3.

Film production is another venue where acoustical information during audio production is important. When film is shot on location and acoustics outside are uncontrollable, mixing for a film audio is typically done on a sound stage by watching the content or action and performing what is called "mix to pix." Also sweetening (adding or refining sound content) is performed on the audio production. The studio enclosure where this action occurs may be acoustically balanced to allow the sound mixer to hear the sound clearly without room acoustic impulses. These production techniques are used to enhance the viewer's listening experience and overcome any deficiencies of the playback audio system, including acoustic impairments brought on by scene changes from indoors to outdoors. These practices also apply to television productions.

The present application takes advantage of the technology changes brought on by digital audio, the progression of electronic integrated circuits, the transmission standard known as AES 3, and the production complexities of modern entertainment to provide a system that allows such audio equipment to duplicate the acoustical information of the original recording. This functionality can advantageously be added to electronic equipment consisting of an amplifier and speakers to change the acoustic dynamics of the playback room with or without an active system designed to enhance the room's response to the sound waves.

BRIEF DESCRIPTION OF THE DRAWINGS

The specific features, aspects and advantages of the present invention will become better understood with regard to the following description and accompanying drawings where.

DETAILED DESCRIPTION

In the following description of the preferred embodiment of the present invention, reference is made to the accompanying drawings, which form a part hereof, and in which is shown by way of illustration specific embodiments in which the invention is may be practiced. It is understood that other embodiments may be utilized and structural changes may be made without departing from the scope of the present invention.

In the following description, numerous specific details are set forth in order to provide a thorough understanding of the present invention. However, it will be apparent to one skilled in the art that the present invention can be practiced without these specific details. In other instances, well known circuits, components, algorithms, and processes have not been shown in detail or have been illustrated in schematic or block diagram form in order not to obscure the present invention in unnecessary detail. Additionally, for the most part, details concerning networks, interfaces, computing systems, and the like have been omitted inasmuch as such details are not considered necessary to obtain a complete understanding of the present invention and are considered to be within the understanding of persons of ordinary skill in the relevant art. It is further noted that, where feasible, all functions described herein may be performed in either hardware, software, firmware, digital components, or analog components or a combination thereof, unless indicated otherwise. Certain terms are used throughout the following description and Claims to refer to particular system components. As one skilled in the art will appreciate, components may be referred to by different names. This document does not intend to distinguish between components that differ in name, but not function. In the following discussion and in the claims, the terms "including" and "comprising" are used in an open-ended fashion, and thus should be interpreted to mean "including, but not limited to . . . ."

Embodiments of the present invention are described herein. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with applications and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

This application discloses a system and method for embedding digital audio acoustic information provided by an exterior room acoustical test system into an AES 3 serial digital data stream. This allows the room acoustical information, such as filter coefficients of the record site to be transmitted by AES-3 to another location where the filter coefficients can be de-embedded from the AES-3 signal and the acoustic information passed to a playback system allowing the acoustical information to be reproduced in order to enhance the playback audio. The playback audio can then be played through speakers or earphones in an automobile, at home or other playback environment.

The disclosed system and method allow a listener of an audio signal to hear the sound acoustically reproduced as if the listener were present at the original recording location. The disclosed system and method may advantageously use the recognized audio serial digital transmission standard called AES 3, which is well known and used in every major audio recording facility in the US. The system and methods disclosed herein allow insertion of the acoustic information, such as filter coefficients, into the AES 3 data stream after digital processing.

This is accomplished by using a test signal at the recording location to electronically measure the acoustic space of the room, hall, or other environment by current acoustic audio measurement techniques known to one skilled in the arts.

The test setup allows audio equipment the ability to measure the acoustic parameters of the audio record environment by emitting a signal to the audio amplifier through the monitor speakers to measure the frequency response within the hearing range of the human ear. As sound waves are complex, especially for musical performances, it is understood that the measurement techniques may encompass multiple tests of various frequencies and levels to accurately plot the acoustic response of the recording space.

This information may be collected by a test microphone or multiple test microphones placed at various locations to assure a plurality of responses and fed to a computer, such as by using a sound board in a computer. The computer may be embodied as any type of general purpose computer such as an Apple™ or Microsoft™ personal computer, smart phone, tablet computer, audio processing device, or the like. For example, a suitable computer may be the specially designed Digital Audio Workstation manufactured and sold in the professional audio industry by various entities like Solid State Logic™, Fairlight™, Studer™ and other manufacturers. By using suitable software a digital signal processor (DSP), which may be part of the computer or computer sound board, may be used to apply acoustic information to a resultant audio signal. The audio signal may be corrected to match an idealized frequency in order to flatten the response curve and/or eliminate or modify acoustic impulse responses that alter the sound. The corrected audio signal may then be returned to an audio amplifier to be fed to the monitor speakers and/or recorded. The acoustic information from testing the recording environment may be retained in a memory, such as a sound board processor memory, which allows an accurate reproduction through filters of frequency and amplitude changes of the recorded music in an acoustic space.

It is to be understood that the testing rigors are an independent event that allows a test, such as an average or means test, to be stored in a memory device. After the test concludes, a musical piece or program can be played through a computer and the results will closely match the acoustic presence of the original performance, i.e., will be frequency correct and have a correct amplitude as perceived by human hearing in a monitoring space.

The acoustic information could be further modified, such as by using enclosure information for an empty space, enclosure information for the same space with an audience present, or by active modification of the acoustic information as the sound is recorded. Human hearing is not the same for all individuals. The information concerning the above method is to be understood by professionals in the art of sound reproduction. In some embodiments, what is realized using the above methods is an average used to replicate electronically the sound an original acoustic space during a recorded event.

The acoustic information calculated as described above may be sent by a computer via a communication channel, such as a USB bus or other digital data transfer schemes, to an encoder. In some embodiments, the encoder may be an AES 3 serial encoder as known in the art. The acoustic information may be embedded into an encoded digital audio data stream, such as an AES 3 stream, for transfer downstream to a listener station, room, hall or other enclosure. The encoded digital audio data stream may also be affixed to a recording medium such as a CD ROM, flash drive, hard drive, or other storage medium.

At the listener location, the acoustic information is recovered from the encoded digital audio data stream. This may be accomplished, for example by an AES-3 signal disembed device, as known in the art, which recovers the acoustic information and transfer the information to a computer using a communication channel, such as USB or other digital data communication channel.

The recovered acoustic information may be placed into the memory of the computer, such as memory associated with the DSP of a sound board to allow active modification of an audio playback signal to reflect the original acoustic presence of the record space. This advantageously enhances the listener's ability to hear the program material as intended as if the piece was being played live and the listener present at the room, concert hall, auditorium, etc. instead of a recorded playback. It is understood that the electronic equipment used to record and playback the audio material preferably has a frequency bandwidth of 20 Hz to 20 KHz, within approximately a half dB. In playback, the electronic equipment used preferably has sufficient power to drive a speaker setup without distortion. Speakers may preferably be placed to enhance the listener's experience at a "sweet spot" and be in sufficient number to drive the sound to the listener in a room, hall, or other environment. In addition, a test microphone used to test the acoustic space preferably has a nearly flat frequency response and is preferably placed to duplicate the listener's position. This may be accomplished as known in the art by persons skilled in the techniques well known to the audio industry.

It is understood that the electronic equipment used to record and playback the audio material preferably has a frequency bandwidth of 20 Hz to 20 KHz, within approximately a half dB. In playback, the electronic equipment used preferably has sufficient power to drive a speaker setup without distortion. Speakers may preferably be placed to enhance the listener's experience at a "sweet spot" and be in sufficient number to drive the sound to the listener in a room, hall, or other environment. In addition, a test microphone used to test the acoustic space preferably has a nearly flat frequency response and is preferably placed to duplicate the listener's position. This may be accomplished as known in the art by persons skilled in the techniques well known to the audio industry.

The following detailed description illustrates the invention by way of example and not by way of limitation. This description will clearly enable one skilled in the art to make and use the invention, and describes several embodiments, adaptations, variations, alternatives and uses of the invention. As various changes could be made in the constructions described herein without departing from the scope of the invention, it is intended that all matter contained in the description or shown in the accompanying drawings shall be interpreted as illustrative and not in a limiting sense.

Figure 1:
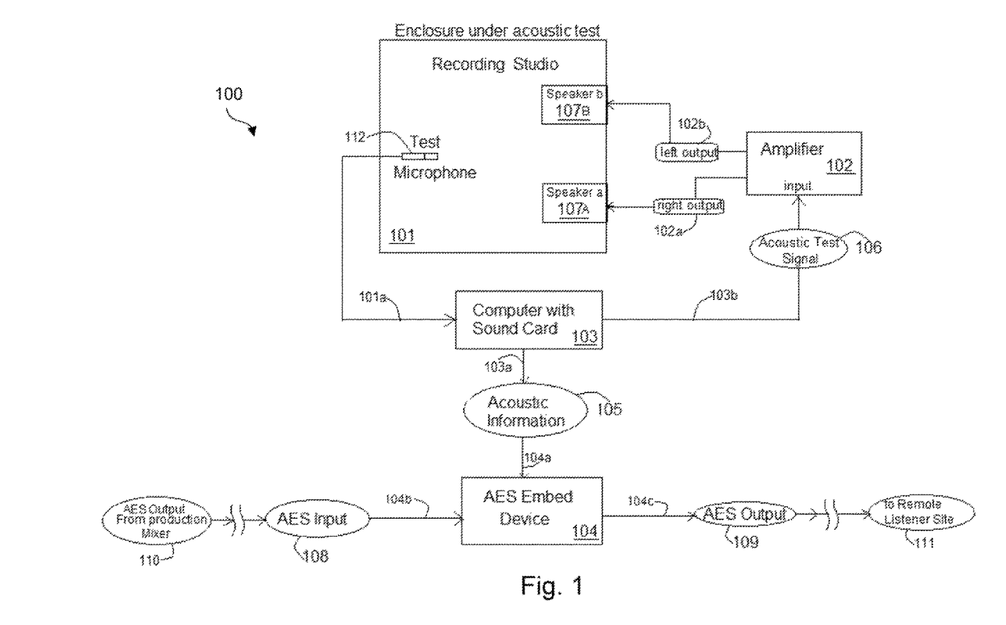
FIG. 1 is a schematic block diagram of a recording system for acquiring environmental acoustic information in accordance with an embodiment of the present invention.

FIG. 1 illustrates an example of a recording system 100. Any system having the capacity to record, process, and play audio signals may benefit from the methods described herein and serve as the recording system. A professional recording studio is a particularly suitable environment to implement the methods disclosed herein. The recording system 100 may include a recording site 101, which may include a recording studio. The recording studio may include full range monitor speakers (stereo or surround 5.1 which consist of left front, right front, midrange, low frequency woofer, left rear, right rear) set at the appropriate spot for playback (well documented in various industry practices). The recording system 100 may also include a monitor grade amplifier 102 with sufficient bandwidth to pass 20 Hz to 20 KHz substantially flatly and the necessary power to drive the speaker set without significantly distorting the sound quality. The recording site 101 may also be embodied as any other interior or exterior location having equipment for recording and emitting sound.

The recording system of FIG. 1 shows a recording site 101 with a stereo setup for simplicity, but a 5.1 speaker system could easily be fitted (with two additional AES channels). The recording system 100 may also include a computer 103, that may be embodied as any general purpose computer, such as an Apple™ computer, Microsoft™ PC, smart phone, tablet computer, or other digital recording equipment. The computer 103 may include sound processing hardware, which may be operable to process stereo or 5.1 input/output. The computer 103, such as the sound processing hardware of the computer 103, may also include a DSP capability. The computer 103 may further be embodied as a Digital Audio Workstation having one or more analog or AES inputs/outputs.

The computer 103 may host a software program for performing enclosure acoustic testing according to the methods described herein. The acoustic test software may be operable to generate a test signal consisting of (but not limited to) white noise, pink noise, audio sweep tone (20 Hz to 20 Khz), logarithmic chirp, or other test signal, to an amplifier 102, through one or more feed lines 102a, 102b, and to a set of one or more speakers 107A, 107B. The signal emitted by the speakers 107A, 107B into the studio 101 or other environment is detected after propagation through the studio 101 to a test microphone 112. The output of the microphone is transmitted by feed line 101a to the Computer 103.

The output of the microphone is used to generate acoustic information 105 derived by the computer sound board's DSP. The acoustic information 105 may be extracted according to an analysis of the original test signal and the signal detected by the microphone 112. The acoustic information may be in the form of filter coefficients effective to restore the received signal to the test signal. Alternatively, the acoustic information may be filter coefficients effective to transform the test signal into the received signal.

The acoustic information may be passed to an embedding device 104, such as an AES Embedding Device 104, such as over an Ethernet cable 103a or other electronic channel. Alternatively, the functionality of the embedding device 104 may be implemented by hardware and/or software hosted by the computer 103 such that the embedding device is omitted. The embedding device 104 embeds the acoustic information in a recording of a performance within the recording site 101. The performance may be recorded using the test microphone 112 or some other microphone or microphone array. The embedded signal 104c is then passed by the embedding device 104 to a listener site 111. The recorded signal input to the embedding device may be in the form of an AES input signal 108 transmitted over line 104b to the embedding device 104. The AES input signal 108 may be output from a recording studio production mixer 110 based on audio signals recorded in the recording site 101.

Figure 2:
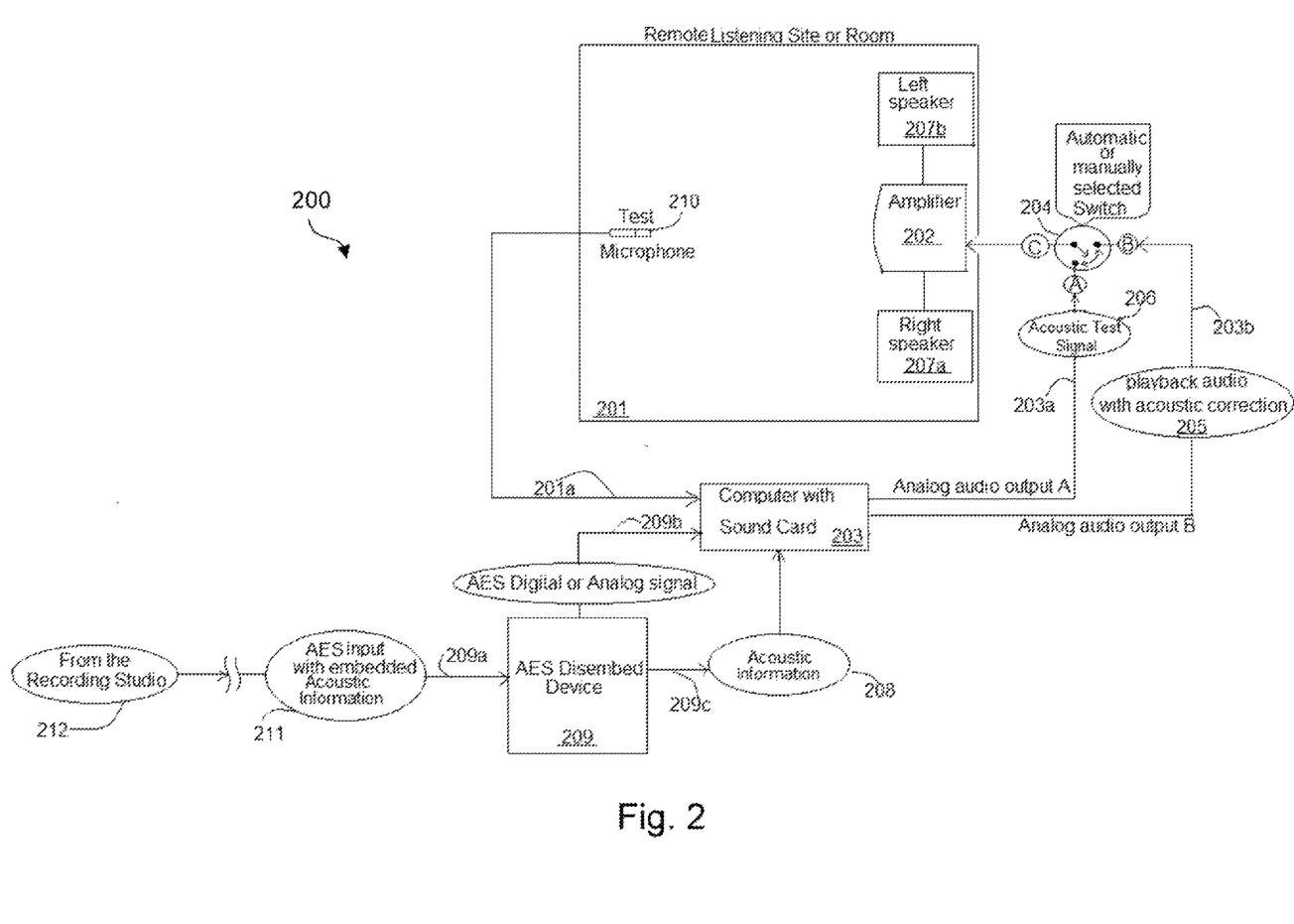
FIG. 2 is a schematic block diagram of a playback system using acquired environmental acoustic information to enhance sound quality in accordance with an embodiment of the present invention.

Referring to FIG. 2, the listening site 201 receives an incoming embedded signal 211. The listening site may be any interior or exterior space such as a room of a dwelling or business, dance club, amphitheater, or the like. The embedded signal may be received as a transmission from the recording site 101 or the embedded signal may be recorded on some tangible medium and then read from the tangible medium to generate the signal 211. As noted above, the embedded signal 211 may be an AES signal having the acoustic information for the recording site 101 embedded therein. The embedded signal 211 may be sent by line 209a to the disembedding device 209, such as an AES Disembed Device. The disembedding device 209 is operable to extract the acoustic information from the signal 211 and extract an audio signal as well.

In some embodiments, acoustic information 208 is sent via a channel 209c, such as an Ethernet or other channel, to a computer 203. An audio signal extracted from the signal 211 may also be sent to the computer 203, such as over channel 209b. The audio signal may be in the form of an analog stereo audio output sent to a sound processing device, such as a sound card, hosted by the computer 203. The audio signal may be converted from digital to analog by a D/A converter by the disembedding device 209 and coupled to the computer via an analog input to the computer. In other embodiments, the audio signal may also be sent to the Computer 203 in digital form utilizing any digital signal format known in the art in order to achieve a particular desired level of performance and cost.

The computer 203 may host program software operable to reconstruct the acoustics from the recording site 101 using the acoustic information recovered from the signal 211. The acoustic information may be used to set filters of a DSP, or other programmable device, hosted by the computer 203 to mimic (by changing the room response to the sound) the original acoustic information. In some embodiments, the acoustic information may include actual filter coefficients used to define a digital or analog filter implemented by the DSP.

An analog audio output 205 may be transmitted over line 203b from the computer 203 to a manually or automatically selected switch input 204B of a switch 204. The output 204C of the switch may be coupled to an amplifier 202, which may be located in the listening site 201. Speakers 207a, 207b are coupled to the amplifier and convert signals from the amplifier to sound waves emitted into the listening site 201. An acoustic test signal 206 can be sent to the listening site 201 by line 203a and connect to switch input 204A. The input 204A may be selected manually or automatically to couple a test signal 206 to the input of the amplifier 202.

In an alternative embodiment, both playback audio and test signals are coupled to an amplifier 202 by means of a single line knot shown) and the computer 203 is programmed to select which signal to generate either automatically or in response to a user input.

In addition, the listening site 201 may contain a test microphone 210, or microphone array 210, and through the return line 201a, the output of the microphone or microphone array 210 may be sent to the computer 203, where the computer acoustic test software program can extract and/or store acoustic information based on an analysis of the output of the microphone(s) and the original test signal 206. The acoustic information for the listening space may be used by the DSP hosted by the computer 203, such as by means of a sound card.

An acoustic test of the listening site 201 may be performed separately by equipment having capabilities known in the art to measure the acoustic information of the enclosure and correct for existing acoustic problems of the listening site. That information may be sent to the Computer 203, which uses the acoustic information to generate an acoustically corrected audio playback, such as by means of an internal sound board's active filters controlled by the DSP.

The acoustic information provided to the same DSP by the disembedding device 209 may be used by a selective active component to determine the acoustics of the original recording. The listener (user) may therefore select via the audio playback software on the computer 203 either the acoustic information obtained using the test signal emitted in the listening site 201 or the original acoustic information supplied embedded in the received signal 211 and extracted using the disembedding device 209, such as an AES Disembed Device in order to achieve acoustically enhanced audio playback of the recorded sounds via 209b.

In addition, playback software hosted by the computer 203 may allow a third option wherein the acoustic information extracted from the signal 211 is combined with acoustic information obtained for the listening site 201 by selectively sampling the sound information of the room during audio playback and allowing the DSP through a set of algorithms to actively balance the acoustic response.

Although the present invention has been described with an exemplary embodiment, various changes and modifications may be suggested to one skilled in the art. It is intended that the present invention encompass such changes and modifications as fall within the scope of the appended claims.

Obviously there exist other digital methods to embed directly to the original recording, the acoustic information of the active origin enclosure space. In one instance the embedded AES information can be recorded to a CD or DVD for playback through systems with the ability to recover the acoustic information. In another method, a recording may be "pre-modified" using the acoustic information obtained for the recording site 101 at the time of recording or fixing to a tangible medium using the methods and system previously discussed. The enhanced recording may then be played through a Compact Disc™ player, video DVD™ player, or other electronic device to closely replicate the sound at the recording site at an arbitrary listening site, such as a dwelling, automobile, earphone, or an enclosure such as a hall or theatre.

In some embodiments, user's amplifier and/or speakers may modify the playback either dynamically or passively by using an active system attached to the amplifier to compensate for the acoustic environment further, though gains in acoustic quality may be small in view of the enhancement obtained using the methods described herein. In some embodiments, the acoustic information may be supplied in a digital format by recording medium or data channel (e.g. USB port) to a professional or consumer amplifier or computer connected to the previously-mentioned devices and containing the necessary circuitry to enhance a broadcast sound using the acoustic information according to the methods described herein.

Figure 3:
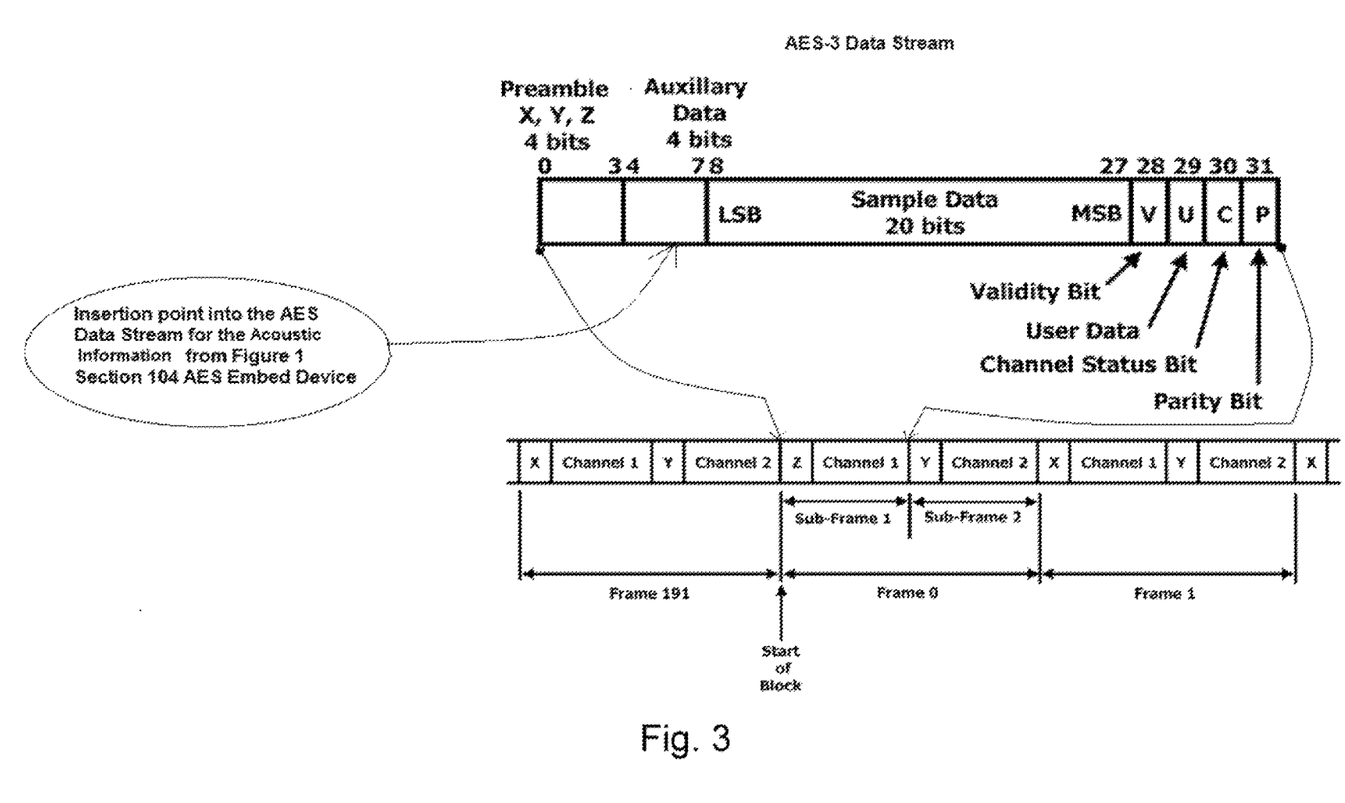
FIG. 3 is a schematic block diagram of a data packet for embedding acquired environmental acoustic information in accordance with an embodiment of the present invention.

FIG. 3 illustrates a data stream that may encode a sampled audio signal as well as acoustic information characterizing the recording space 101. As shown, a data stream may include various channels (channel 1, channel 2, etc.) occurring serially in a data stream according to a time-division multiplexing scheme. A channel time slot may include one or more frames (x, y), which may correspond to right and left inputs for stereo or the various channels of a Dolby surround signal.

The frames transmitted in a particular channel may include a preamble (4 bit s in the illustrated example), auxiliary data (4 bits), sample bits (20 bits), and various other bits to verify manage communication and verify the accuracy of the data such as a validity bit, user data bit, channel status bit, and a parity bit. As noted above, acoustic information obtained for the recording site may be encoded in the auxiliary data bits. In instances where other bits are not used, these bits may also be used to encode acoustic information. As already noted, the data packets and data stream format may correspond to an AES 3 data stream.

Figure 4:
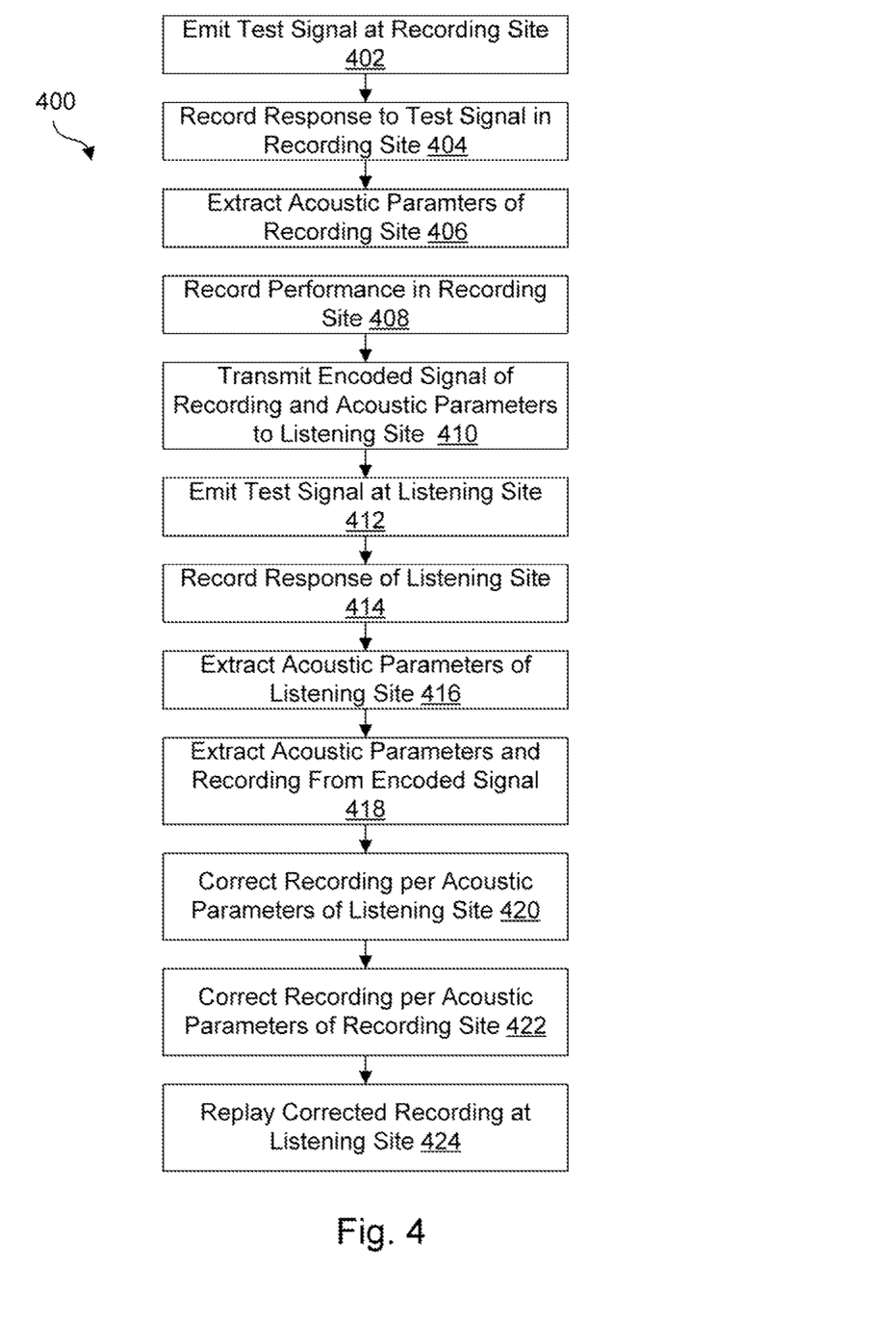
FIG. 4 is a process flow diagram of a method for acquiring environmental acoustic information and playing back recordings using such information in accordance with an embodiment of the present invention.

FIG. 4 illustrates a method 400 for generating and playing an enhanced audio recording. At step 402 a test signal is emitted into a recording space. The emitted signal may be an impulse (e.g. click), white noise, pink noise, audio sweep tone, chirped signal, logarithmic chirped signal, or some other signal. The signal may be generated by a computer or by analog signal generating equipment. The signal may be generated by a computer 103 and coupled through an amplifier 102 to speakers 107a, 107b in the system shown in FIG. 1.

The response of the recording site to the emitted signal may be recorded 404. A single microphone or a microphone array may perform the recording step 404. The recorded response may then be analyzed; such as by means of a comparison to the test signal and acoustic parameters describing the acoustic response of the room may be extracted at step 406 according to this analysis. The acoustic parameters may be in the form of coefficients for a digital or analog filter that are effective to convert the test signal to the recorded signal or vice versa.

The outputs of the microphones may be sampled or otherwise converted to digital data and stored by the computer 103. A performance at the recording site may then be recorded at step 408. This may include detecting sound with one or more microphones and then sampling the outputs of the microphones and storing the result by means of a computer, such as the computer 103.

The sampled audio signal may be further processed or enhanced as known in the art of audio engineering. The processed or original sampled signal may then be transmitted at step 410 over a data channel or affixed at step 410 to a recording medium together with the acoustic parameters. This may include embedding the acoustic parameters in a digital encoding of the processed or original sampled signal, such as in an AES encoded digital recording. The acoustic parameters may be embedded in the auxiliary or other bit positions of a data packet, such as the data packet illustrated in FIG. 3.

At the listening site, a test signal may be emitted at step 412 into the listening site and a response to the test signal may then be received by a microphone or microphone array and recorded at step 414. The test signal may have any or all of the attributes of examples of test signals described herein. A response of the listening site to the test signal may be analyzed and acoustic parameters characterizing the listening site may be extracted at step 416. As noted above, the acoustic parameters for the listening site may be coefficients for a digital or analog filter effective to convert the test signal to the recorded response or vice versa. A digitally encoded signal may then be received or read from a medium to which it is affixed and both an audio signal and acoustic parameters for the recording site may be extracted therefrom at step 418. The audio signal may then be corrected or enhanced by one or both of correcting step 420 the audio signal according to the acoustic parameters of the listening site and correcting step 422 the audio signal according to the acoustic parameters of the recording site. The corrected audio signal may then be replayed at step 424 at the listening site through a speaker system such as are described hereinabove.

Figure 5:
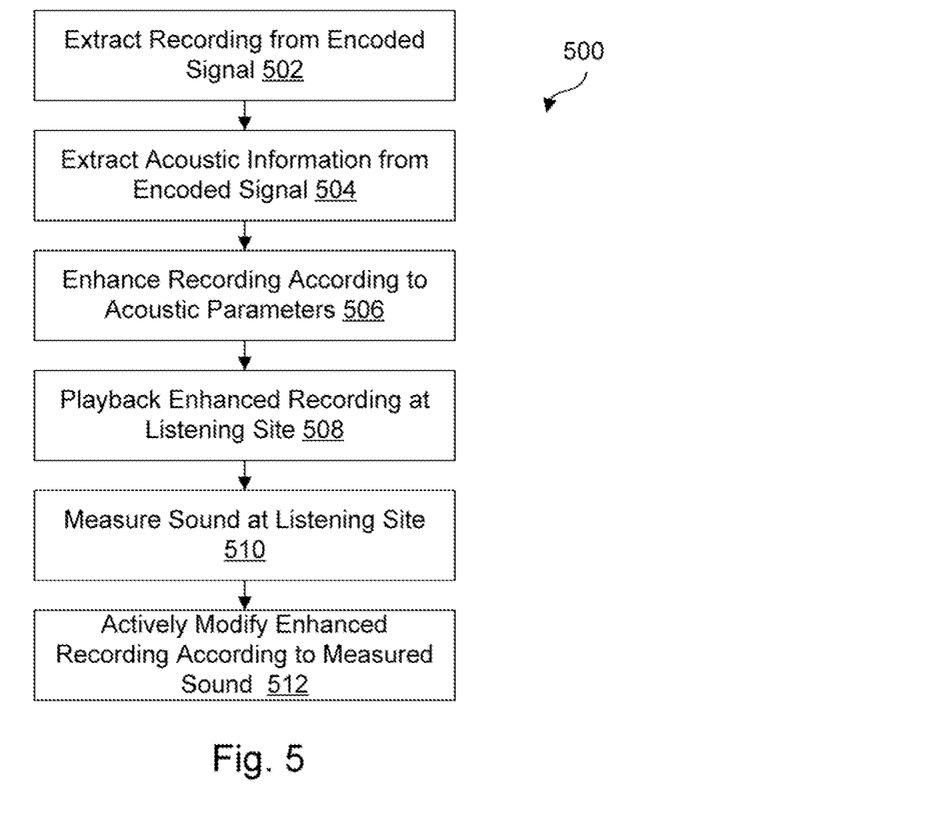
FIG. 5 is a process flow diagram of an alternative method for acquiring environmental acoustic information and playing back recordings using such information in accordance with an embodiment of the present invention.

FIG. 5 illustrates an alternative method 500 for playing back an audio signal having acoustic parameters for the recording site associated therewith. As noted above, the audio signal may be received for read from a medium to which it is affixed. The acoustic parameters may be embedded in an encoded version of the audio signal as described hereinabove. The method steps of FIG. 5 may also be preceded by extracting acoustic parameters for the listening site as described above with respect to FIG. 4.

The method 500 may include step 502 extracting an audio signal from an encoded audio signal that has been received over a transmission medium or read from a medium to which it has been affixed. Acoustic parameters for the recording site may also be extracted at step 504 from the encoded audio signal as described hereinabove. The audio signal may be corrected at step 506 or otherwise enhanced according to the acoustic parameters for the recording site. This may include filtering the audio signal using the acoustic parameters as coefficients for an analog or digital filter. Enhancement step 506 may also include enhancing the audio signal according to acoustic parameters for the listening site obtained as described above with respect to FIG. 4.

The enhanced signal may then be played back at step 508 at the listening site. The sound in the listening site may be measured at step 510 during playback such as by means of a microphone or microphone array. The measured sound may then be used in combination with one or more of the audio signal, acoustic parameters for the listening site, and acoustic parameters for the recording site, at step 512 to actively enhance and/or correct the quality of the playing audio signal. In one embodiment, this may include modifying a set of filter coefficients, or other sound processing parameters effective to cause the measured sound to be closer to the audio signal as enhanced using the acoustic parameters for the recording site.

Figure 6:
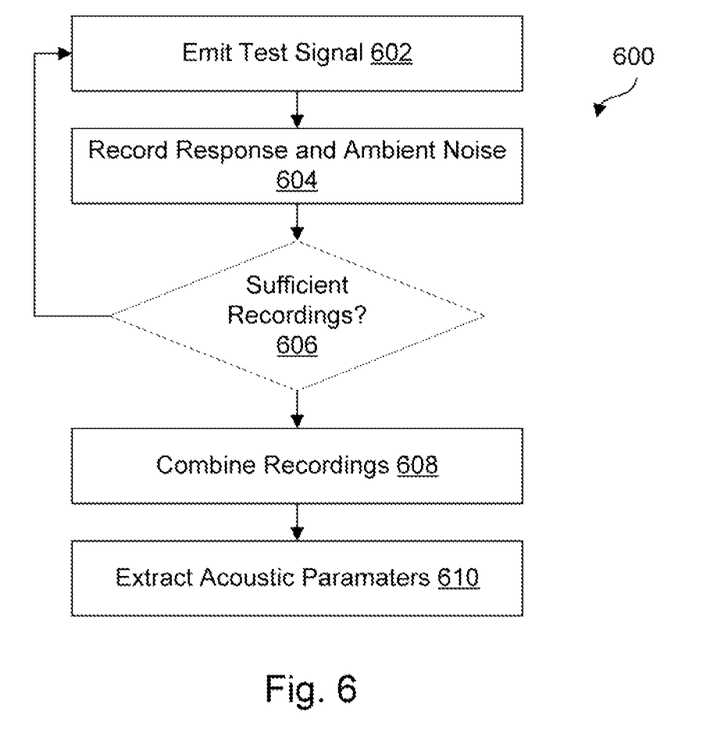
FIG. 6 is a process flow diagram of a method for testing an acoustic environment in accordance with an embodiment of the present invention.

FIG. 6 is a schematic block diagram of a method 600 for performing tests of the acoustic properties of an acoustic environment such as a recording site or a listening site. In many recording environments, it is undesirable and sometimes impossible to generate a test signal in a quiet room and obtain an accurate acoustic response. For example in a small venue such as a small dinner theater the acoustic response obtained with the venue is empty is not the same as the response which will be obtained when patrons are seated because filling the venue with patrons will alter the acoustics for various reasons, e.g. the patrons will absorb sound whereas the empty seats do not.

On the other hand, it would be highly undesirable, if not impossible, to have the patrons sit quietly while an acoustic test is run. In order to overcome this problem the test signal might be generated at a loud enough level that the background noise from the patrons will not affect the test, however this is undesirable for a test signal of any substantial (e.g. audible to the patrons) level and duration. Thus it would be preferred to select a test signal having a combination of short duration and low loudness level to allow testing without unduly distracting or annoying the patrons. Alternatively it would be desirable to incorporate background noise cancellation in the acquisition and/or processing of a test signal having lower loudness and longer duration than above which again would not be unduly distracting or annoying to the patrons.

Accordingly, the method 600 may be used to characterize an acoustic environment with a test signal without unduly drawing the attention or irritating persons present in the acoustic environment. The method 600 may include step 602 for repeatedly emitting a test signal into an acoustic environment, such as by means of speakers and recording step 604 for recording the acoustic response of the environment for each test signal until a sufficient number of recordings is found in 606 to have been made. The number of recordings may be a fixed number or may be determined according to an analysis of the recordings.

The test signal may be of the form of any of the other test signals mentioned herein such as a pulse of any shape, a frequency sweep, a single frequency tone, or the like. Each test signal may be of a known and preferably short duration, e.g. 1 second or less, and may be repeated at an arbitrary interval, e.g. 5 seconds. The maximum amplitude of the test signal may be chosen so as to not be alarming or irritating to persons in the acoustic environment. This may be accomplished by measuring a sound level for the acoustic environment may be measured and the maximum amplitude of the test signal may be chosen to be equal or a given amount larger than this sound level.

The recordings may then be combined at 608 and acoustic parameters for the acoustic environment may be extracted at 610. The acoustic environment may be a recording site or a listening site. The parameters may be extracted according to any of the methods described herein and may be embodied as filter coefficients as also noted herein.

Because the test signal itself and the time it is played is known, removing unrelated background noise can be accomplished in part by correlating the received sound. By making several tests and averaging the results much of the random (with respect to the test signal) background noise can be eliminated or substantially reduced. For example if a 1 kHz tone lasting 1 second is repeated every 5 seconds, and the received version of all the tests are averaged, the random noise in the averaged result will be reduced by the square root of number averaged since the repetitive tone will add linearly for every test whereas the random noise only adds by the square root. Accordingly, in some embodiments, for combining step 608 the recordings may include averaging them.

As noted above, the number of tests signals and corresponding recordings Obtained may be based on analysis of the recordings. In some embodiments, steps 602 and 604 may be repeated until the noise floor due to ambient noise is a certain decibel level below a maximum amplitude of correlated components of the recordings due to the test signal. For example, a 20 dB difference between the maximum amplitude of the correlated test signal response and the uncorrelated noise may be a suitable threshold at which to stop emitting test signals and recording the response. As this statement implies, the method steps 608 and 610 may also be performed repeatedly until confidence in the signal-to-noise ratio (SNR) of the measured response is achieved. In other embodiments, an absolute maximum amplitude of the averaged signals may be compared to a threshold to determine when to discontinue testing. For example, if the test signal has an amplitude of 60 dB, testing may continue until the combined signals have a maximum amplitude of 80 dB, or some other value.

Figure 7:
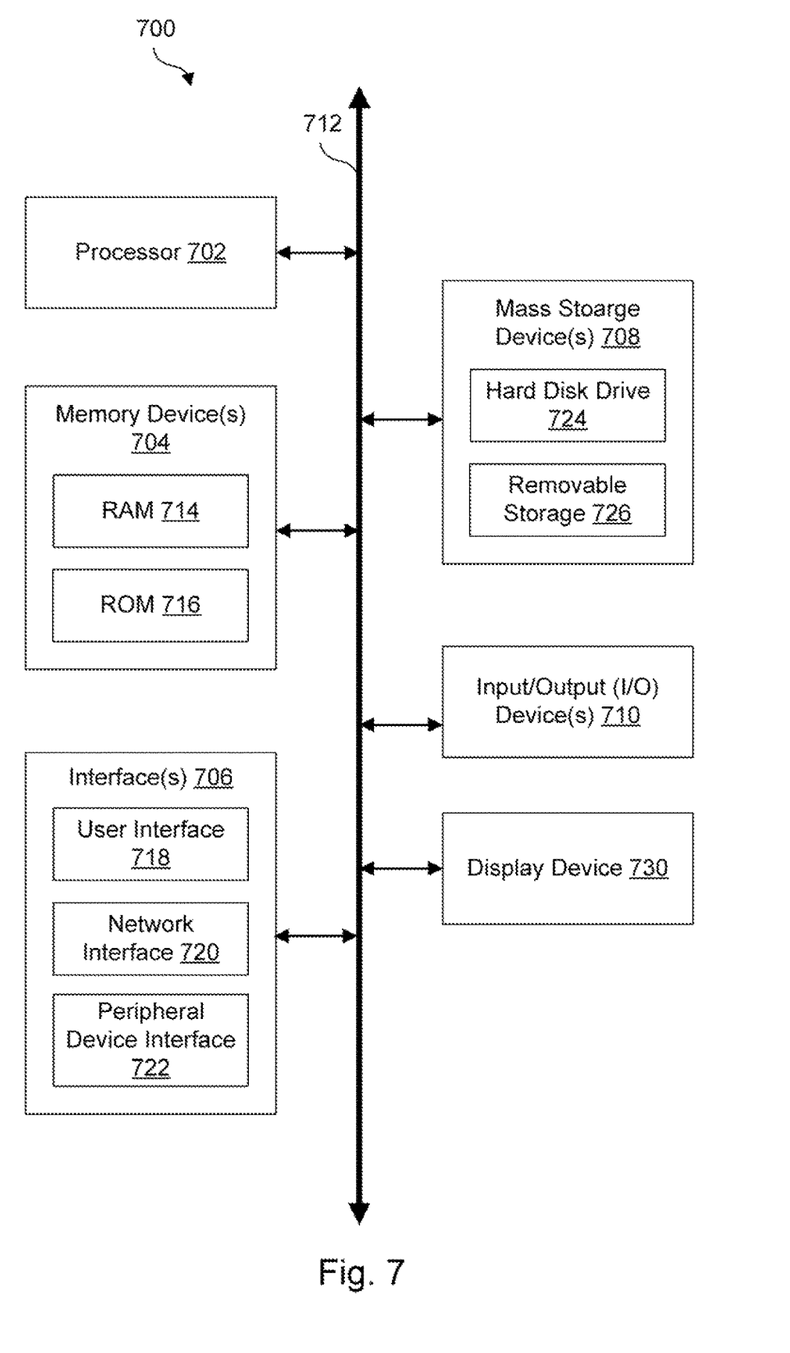
FIG. 7 is a schematic block diagram of a suitable computing device for performing methods in accordance with embodiments of the present invention.

FIG. 7 is a block diagram illustrating an example computing device 700. Computing device 700 may be used to perform various procedures, such as those discussed herein. For example, the computers 103, 203 may be embodied as a computing device 700. Computing device 700 can function as a server, a client, or any other computing entity. Computing device can perform various monitoring functions as discussed herein, and can execute one or more application programs, such as the application programs described herein. Computing device 700 can be any of a wide variety of computing devices, such as a desktop computer, a notebook computer, a server computer, a handheld computer, tablet computer and the like.

Computing device 700 includes one or more processor(s) 702, one or more memory device(s) 704, one or more interface(s) 706, one or more mass storage device(s) 708, one or more Input/Output (I/O) device(s) 710, and a display device 730 all of which are coupled to a bus 712. Processor(s) 702 include one or more processors or controllers that execute instructions stored in memory device(s) 704 and/or mass storage device(s) 708. Processor(s) 702 may also include various types of computer-readable media, such as cache memory.

Memory device(s) 704 include various computer-readable media, such as volatile memory (e.g., random access memory (RAM) 714) and/or nonvolatile memory (e.g., read-only memory (ROM) 716). Memory device(s) 704 may also include rewritable ROM, such as Flash memory.

Mass storage device(s) 708 include various computer readable media, such as magnetic tapes, magnetic disks, optical disks, solid state memory (e.g., Flash memory), and so forth. As shown in FIG. 7, a particular mass storage device is a hard disk drive 724. Various drives may also be included in mass storage device(s) 708 to enable reading from and/or writing to the various computer readable media. Mass storage device(s) 708 include removable media 726 and/or non-removable media.

I/O device(s) 710 include various devices that allow data and/or other information to be input to or retrieved from computing device 700. Example I/O device(s) 710 include cursor control devices, keyboards, keypads, microphones, monitors or other display devices, speakers, printers, network interface cards, modems, lenses, CCDs or other image capture devices, and the like.

Display device 730 includes any type of device capable of displaying information to one or more users of computing device 700. Examples of display device 730 include a monitor, display terminal, video projection device, and the like.

Interface(s) 706 include various interfaces that allow computing device 700 to interact with other systems, devices, or computing environments. Example interface(s) 706 include any number of different network interfaces 720, such as interfaces to local area networks (LANs), wide area networks (WANs), wireless networks, and the Internet. Other interfaces include user interface 718 and peripheral device interface 722.

Bus 712 allows processor(s) 702, memory device(s) 704, interface(s) 706, mass storage device(s) 708, and I/O device(s) 710 to communicate with one another, as well as other devices or components coupled to bus 712. Bus 712 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 700, and are executed by processor(s) 702. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

As discussed herein, the invention may involve a number of functions to be performed by a computer processor, such as a microprocessor. The microprocessor may be a specialized or dedicated microprocessor that is configured to perform particular tasks according to the invention, by executing machine-readable software code that defines the particular tasks embodied by the invention. The microprocessor may also be configured to operate and communicate with other devices such as direct memory access modules, memory storage devices, Internet-related hardware, and other devices that relate to the transmission of data in accordance with the invention. The software code may be configured using software formats such as Java, C++, XML (Extensible Mark-up Language) and other languages that may be used to define functions that relate to operations of devices required to carry out the functional operations related to the invention. The software code may also include scripting languages such Pearl, Python, PHP, and the like. The code may be written in different forms and styles, many of which are known to those skilled in the art. Different code formats, code configurations, styles and forms of software programs and other means of configuring code to define the operations of a microprocessor in accordance with the invention will not depart from the spirit and scope of the invention.

Within the different types of devices, such as laptop or desktop computers, hand held devices with processors or processing logic, and also possibly computer servers or other devices that utilize the invention, there exist different types of memory devices for storing and retrieving information while performing functions according to the invention, this is used for transitive and non-transitive storage. Cache memory devices are often included in such computers for use by the central processing unit as a convenient storage location for information that is frequently stored and retrieved. Similarly, a persistent memory is also frequently used with such computers for maintaining information that is frequently retrieved by the central processing unit, but that is not often altered within the persistent memory, unlike the cache memory. Main memory is also usually included for storing and retrieving larger amounts of information such as data and software applications configured to perform functions according to the invention when executed by the central processing unit. These memory devices may be configured as random access memory (RAM), static random access memory (SRAM), dynamic random access memory (DRAM), flash memory, and other memory storage devices that may be accessed by a central processing unit to store and retrieve information. During data storage and retrieval operations, these memory devices are transformed to have different states, such as different electrical charges, different magnetic polarity, and the like. Thus, systems and methods configured according to the invention as described herein enable the physical transformation of these memory devices. Accordingly, the invention as described herein is directed to novel and useful systems and methods that, in one or more embodiments, are able to transform the memory device into a different state during transitive and non-transitive storage. The invention is not limited to any particular type of memory device, or any commonly used protocol for storing and retrieving information to and from these memory devices, respectively.

Although the components and modules illustrated herein are shown and described in a particular arrangement, the arrangement of components and modules may be altered to process data in a different manner. In other embodiments, one or more additional components or modules may be added to the described systems, and one or more components or modules may be removed from the described systems. Alternate embodiments may combine two or more of the described components or modules into a single component or module.

Finally, although specific embodiments of the invention have been described and illustrated, the invention is not to be limited to the specific forms or arrangements of parts so described and illustrated. The scope of the invention is to be defined by the claims appended hereto, any future claims submitted here and in different child applications, and their equivalents.

The foregoing description has been presented for the purposes of illustration and description. It is not intended to be exhaustive or to limit the invention to the precise form disclosed. Many modifications and variations are possible in light of the above teaching. Further, it should be noted that any or all of the aforementioned alternate embodiments may be used in any combination desired to form additional hybrid embodiments of the invention.

It will be appreciated that the subject matter claimed herein is not restricted to the particular embodiment that has been described, and that variations may be made therein without departing from the scope of the subject matter defined in the appended claims, as interpreted in accordance with principles of prevailing law, including the doctrine of equivalents or any other principle that enlarges the enforceable scope of a claim beyond its literal scope. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated. The word "comprise" or a derivative thereof, when used in a claim, is used in a nonexclusive sense that is not intended to exclude the presence of other elements or steps in a claimed structure or method.

What is claimed is:

1. A method for enhancing audio signals comprising:
   emitting recording test signals having various frequencies and levels into a recording environment;
   recording a response to the recording test signals using a recording system;
   extracting recording acoustic information according to analysis of the test signals and the responses thereto;
   recording an audio event in the recording environment to generate an original recording; and
   generating an enhanced recording including both an audio signal corresponding to the original recording and the recording acoustic information.

2. The method of claim 1, further comprising:
   receiving the enhanced recording by a playback system;
   extracting the recording acoustic information from the enhanced recording;

correcting the audio signal according to the recording acoustic information; and audibly presenting the corrected audio signal in a playback environment.

3. The method of claim 2, further comprising:

emitting a playback test signal in the playback environment;

recording a response to the playback test signal; and extracting playback acoustic information according to analysis of the playback test signal and the recorded response thereto;

wherein correcting the audio signal according to the recording acoustic information further comprises correcting the audio signal according to both the recording and playback acoustic information.

4. The method of claim 2, further comprising:

measuring sound in the playback environment during audible presentation of the corrected audio signal;

actively modifying the corrected audio signal according to the measured sound and recording acoustic information during audible presentation of the corrected audio signal.

5. The method of claim 1, wherein generating the enhanced recording incorporating the audio signal corresponding to the original recording and the recording acoustic information further comprises:

encoding the audio signal in an audio format having both sample bits and auxiliary bits, the audio signal being encoded in the sample bits; and encoding the recording acoustic information in the auxiliary bits.

6. The method of claim 5, wherein the enhanced recording is in Audio Engineering Society (AES) 3 format.

7. The method of claim 1, wherein said recording test signals include at least one of white noise, pink noise, audio sweep tone (20 Hz to 20 Khz) and logarithmic chirp and extracting recording acoustic information comprises generating filter coefficients.

8. The method of claim 1, wherein said recording test signals include at least a plurality of white noise, pink noise, audio sweep tone (20 Hz to 20 Khz) and logarithmic chirp and extracting recording acoustic information is performed by a digital signal processor (DSP).

9. A method for enhancing audio signals comprising:

emitting a playback test signal in a playback environment;

recording a response to the playback test signal;

extracting playback acoustic information according to analysis of the test signal and the recorded response;

extracting recording acoustic information from multiple tests of various frequencies and levels from an encoded signal;

extracting an audio signal from the encoded signal;

correcting the audio signal according to the recording acoustic information and the playback acoustic information; and audibly presenting the corrected audio signal in the playback environment using a speaker system.

10. The method of claim 9, further comprising:

measuring sound in the playback environment during audible presentation of the corrected audio signal; and actively modifying the corrected audio signal according to the measured sound and said recording acoustic information during audible presentation of the corrected audio signal.

11. A system for enhancing audio signals comprising one or more processors and one or more memory devices operably coupled to the one or more processors, the one or more memory devices storing executable and operational data effective to cause the one or more processors to:

transmit multiple recording test signals of various frequencies and levels to at least one speaker in a recording environment;

receive from at least one microphone a response of the recording environment to the recording test signals;

extract recording acoustic information according to analysis of the recording test signals and the responses thereto;

receive from at least one microphone a sound recording of an audio event in the recording environment; and generate an enhanced signal including both an audio signal corresponding to the sound recording and the recording acoustic information.

12. The system of claim 11, wherein the executable and operational data are further effective to cause the one or more processors to:

receive the enhanced signal;

extract the recording acoustic information from the enhanced signal;

correct the audio signal according to the recording acoustic information; and transmit the corrected audio signal for playback in a playback environment.

13. The system of claim 12, wherein the executable and operational data are further effective to cause the one or more processors to:

transmit to at least one speaker a playback test signal in the playback environment;

receive from at least one microphone a measured audible response to the playback test signal; and extract playback acoustic information according to analysis of the playback test signal and the measured audible response;

wherein correcting the audio signal according to the recording acoustic information further comprises correcting the audio signal according to both the recording and playback acoustic information.

14. The system of claim 12, wherein the executable and operational data are further effective to cause the one or more processors to:

receive from at least one microphone measurements of sound in the playback environment during audible presentation of the corrected audio signal;

actively modify the corrected audio signal according to the measurements of sound during audible presentation of the corrected audio signal.

15. The system of claim 11, wherein the executable and operational data are further effective to cause the one or more processors to generate the enhanced signal incorporating the audio signal corresponding to the original recording and the recording acoustic information by:

encoding the audio signal in an audio format having both sample bits and auxiliary bits, the audio signal being encoded in the sample bits; and encoding the recording acoustic information in the auxiliary bits.

16. The system of claim 13, wherein the enhanced signal is in Audio Engineering Society (AES) 3 format.

17. The system of claim 11, wherein said recording test signals include at least one of white noise, pink noise, audio sweep tone (20 Hz to 20 Khz) and logarithmic chirp and the executable and operational data are further effective to cause the one or more processors to extract recording acoustic information comprises by generating filter coefficients.

18. The system of claim 11, further comprising a digital signal processor (DSP);

wherein said recording test signals include at least a plurality of white noise, pink noise, audio sweep tone (20 Hz to 20 Khz) and logarithmic chirp and extracting recording acoustic information is performed by the digital signal processor (DSP).

19. A system for enhancing audio signals comprising one or more processors and one or more memory devices operably coupled to the one or more processors, the one or more memory devices storing executable and operational data effective to cause the one or more processors to:

transmit a playback test signal to at least one speaker in a playback environment;

receive from one or more microphones a measured response of the playback environment to the playback test signal;

extract playback acoustic information according to analysis of the test signal and the recorded response;

receive an encoded signal;

extract recording acoustic information from multiple tests of various frequencies and levels from an encoded signal;

extract an audio signal from the encoded signal;

correct the audio signal according to the recording acoustic information and the playback acoustic information; and     transmit to the at least one speaker in the playback environment the corrected audio signal.

20. The system of claim 19, wherein the executable and operational data are further effective to cause the one or more processors to:

receive from the one or more microphones sound measurements from the playback environment during audible presentation of the corrected audio signal; and     actively modify the corrected audio signal according to the sound measurements and the recording acoustic information during audible presentation of the corrected audio signal.

\* \* \* \* \*